United States Patent
Hayes et al.

(10) Patent No.: US 11,150,818 B2
(45) Date of Patent: Oct. 19, 2021

(54) MEMORY ARRAY HAVING POWER CONSUMPTION CHARACTERISTICS

(71) Applicant: International Business Machines Corporation, Armonk, NY (US)

(72) Inventors: Russell Hayes, New Paltz, NY (US); Paul Alan Bunce, Poughkeepsie, NY (US); Brian James Yavoich, Highland, NY (US); John Davis, Wallkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 111 days.

(21) Appl. No.: 16/567,670

(22) Filed: Sep. 11, 2019

(65) Prior Publication Data
US 2021/0072905 A1 Mar. 11, 2021

(51) Int. Cl.
*G06F 3/06* (2006.01)

(52) U.S. Cl.
CPC .......... *G06F 3/0625* (2013.01); *G06F 3/0659* (2013.01); *G06F 3/0673* (2013.01)

(58) Field of Classification Search
CPC ..... G06F 3/0625; G06F 3/0659; G06F 3/0673
See application file for complete search history.

(56) References Cited

U.S. PATENT DOCUMENTS

| 6,212,665 B1 | 4/2001 | Zarkesh et al. |
| 2009/0271167 A1 | 10/2009 | Zhu et al. |
| 2014/0249782 A1* | 9/2014 | Cummings ........... G06F 30/367 703/2 |
| 2015/0134989 A1* | 5/2015 | Chun ................... G11C 7/1009 713/323 |
| 2016/0098504 A1* | 4/2016 | Larzul .................. G06F 30/367 716/136 |

FOREIGN PATENT DOCUMENTS

WO 2016057138 A1 4/2016

OTHER PUBLICATIONS

Transmittal Form PTO/SB/21, signed Mar. 17, 2020.
(Continued)

*Primary Examiner* — Aracelis Ruiz
(74) *Attorney, Agent, or Firm* — Cantor Colburn LLP; Margaret McNamara

(57) ABSTRACT

Embodiments of the present invention are directed to methods, systems, and circuitry for reduced error in power consumption estimation for distinct circuitries. A non-limiting example includes distinct circuitry having an optimized power consumption definition. The distinct circuitry includes a substrate. The distinct circuitry includes an arrangement of interoperable hardware components disposed on the substrate having input pins defined according to a model described by a hardware description language operable to emulate toggle events of the interoperable hardware components defined by the model having a toggle event count based on combinations of the toggle events that correspond to predetermined power quantities. The toggle events define an aggregate toggle power consumption closer to an actual power consumption than an aggregate pin power consumption based on the input pins.

19 Claims, 6 Drawing Sheets

(56) References Cited

OTHER PUBLICATIONS

Prabakaran, R. et al. "Power estimation techniques for embedded and VLSI system: A survey", Electrical Engineering, vol. 53, 2012, pp. 12005-12022.
Paruthi, V. "Large-scale Application of Formal Verification: From Fiction to Fact", IBM Systems and Technology Group, Austin, TX, USA. 6 Pages.

* cited by examiner

```
-- (comment)
library IEEE;                    202
use IEEE.std_logic.all;

-- entity entity ANDGATE is
   port (
        I1 : in std_logic;
        I2 : in std_logic;
        O  : out std_logic) ;
end entity ANDGATE;

-- architecture architecture RTL of ANDGATE is
begin

O <= I1 and I2;
end architecture RTL;
```

MEMORY ARRAY HAVING POWER CONSUMPTION CHARACTERISTICS

BACKGROUND

The present invention relates to memory arrays, and more specifically, to the use of methods to estimate the actual power consumption associated with the memory array.

SUMMARY

Embodiments of the present invention are directed to methods, systems, and circuitry for reduced error in power consumption estimation for distinct circuitries. A non-limiting example includes a memory array having an optimized power consumption definition. The memory array includes a substrate. The memory array includes an arrangement of interoperable hardware components disposed on the substrate to form cells and related circuitry having input pins defined according to a model described by a hardware description language operable to emulate toggle events of the interoperable hardware components defined by the model having a toggle event count based on combinations of the toggle events that correspond to predetermined power quantities. The toggle event count defines an aggregate toggle power consumption of the memory array.

Embodiments also include a computer-implemented method for minimizing error between an actual power consumption of distinct circuitry and an estimated power consumption. The method includes emulating toggle events defined by a hardware description language that specifies an arrangement of interoperable hardware components having input pins of the distinct circuitry. The method includes aggregating the toggle events to form a toggle event count according to combinations of the toggle events corresponding to predetermined power quantities. The method includes combining the predetermined power quantities according to the combinations of the toggle events to define an aggregate toggle power consumption such that the aggregate toggle power consumption associated with the distinct circuitry is closer to the actual power consumption than an aggregate pin power consumption associated with the distinct circuitry.

Embodiments further includes a computer program product for optimizing a power consumption definition of a memory array. The computer program product includes a digital storage device. The computer program product includes stored instructions stored on the digital storage device operable upon execution by a processor to aggregate emulated toggle events defined by a hardware description language in a model that specifies the memory array having an arrangement of interoperable hardware components and defines input pins. The emulated toggle events form a toggle event count according to a plurality of combinations of the toggle events corresponding to predetermined power quantities to define an aggregate toggle power consumption such that the aggregate toggle power consumption associated with distinct circuitry is closer to the actual power consumption than an aggregate pin power consumption based on input pins associated with the memory array.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates a representative model of distinct circuitry in accordance with one or more embodiments of the present invention;

DETAILED DESCRIPTION

Figure 1:
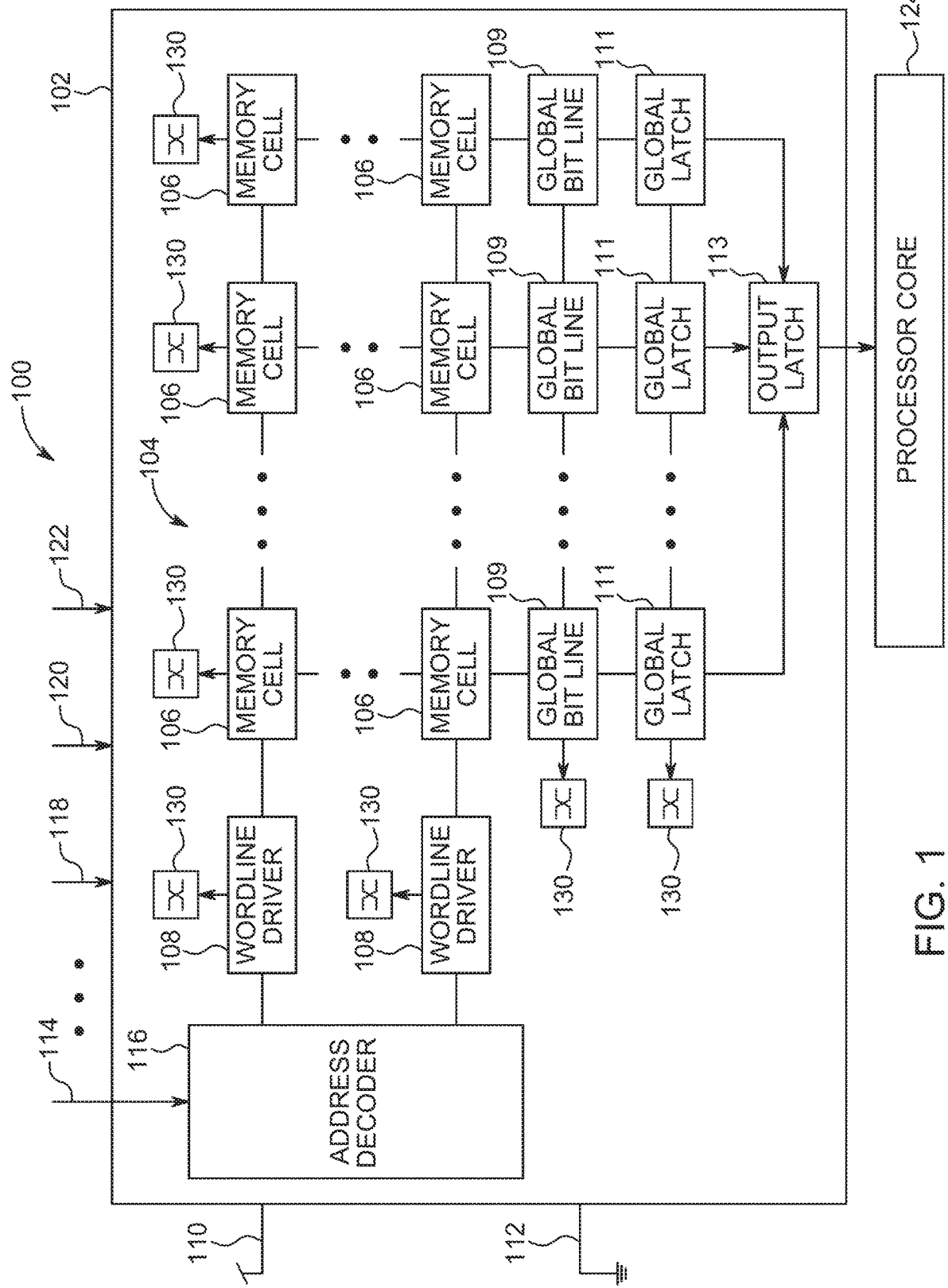
FIG. 1 illustrates distinct circuitry having an arrangement of interoperable hardware components in accordance with one or more embodiments of the present invention.

Referring to FIG. 1, a distinct circuitry 100 is shown in accordance with one or more embodiments of the present invention. The distinct circuitry 100 may be a memory array or portions thereof, and thus may also be referred to as memory array 100. Distinct circuitry 100 may be any circuitry bounded by partitions or sections of larger circuitries. As an example, the distinct circuitry 100 may be a distinct memory chip or macro associated with a larger memory array. Boundaries for the distinct circuitry 100 may be defined by substrates, integration boundaries, or other perimeters related to function or operation.

The distinct circuitry 100 may be disposed on a substrate 102. The substrate 102 may be any type of wafer or semiconductor component configured to support circuits—integrated or otherwise—and other microelectronic devices. An arrangement of interoperable hardware components 104 is disposed on the substrate 102. The distinct circuitry 100 may be configured to draw power through at least one power pin 110 and at least one ground pin 112, defining an actual power consumption based on the voltage and current through the power pin 110 and ground pin 112. The arrangement of interoperable hardware components 104 may be any collective of logic, wires, transistors, diodes, latches, switches, flip-flops, or other implements. Some of the interoperable hardware components 104 may be memory cells 106. The memory cells 106 may SRAM, DRAM, FLASH, or any other implement. The interoperable hardware components 104 can include word line drivers 108 for driving reading and writing of the memory cells 106. The memory cells 106 may be associated with global bit lines 109. The global bit lines 109 may output logical data associated with more than one of the memory cells 106. The state of global bit lines 109 may be stored in global latches 111 that correspond to each of the global bit lines 109. The global latches 111 may be multiplexed or otherwise configured to output to an output latch 113. The output latch 113 may provide the processor core 124 with the requested memory address values. The distinct circuitry 100 may be a level-one (L1) cache associated with the processor core 124.

It should be appreciated that the memory array may be considered a digital storage device that is non-transitory. The coupled processor core 124 may be configured to, upon execution, operate instructions stored in the digital storage device. The instructions may be operable upon execution to perform any steps, emulations, aggregations, or combinations described herein.

The distinct circuitry 100 can include input pins 114, 118, 120, 122. The address decoder input pin 114 may receive an address directing the particular memory cells 106 subject to particular reads and writes. The address decoder 116 decodes the address from the address decoder input pin 114 and energizes word lines or bit lines as necessary corresponding to the particular memory cells 106. The read or write action pin 118 can indicate whether the distinct circuitry 100 is in a read or write mode. The address read disable pin 120 can indicate whether the associated addresses from the address decoder pin 114 are read-disabled. The write enable pin 122 can indicate whether the associated addresses from the address decoder pin 114 are write-enabled. Those versed in the art will readily appreciate that typical distinct circuitry 100 may include numerous input pins 114, 118, 120, 122 in addition to those described, providing a plethora of functional capabilities.

The arrangement of interoperable hardware components 104 defines toggle events 130. The toggle events 130 correspond to occurrences where logic within the particular interoperable hardware components 104 change state (e.g., TRUE to FALSE, ON to OFF). As non-limiting examples, a toggle event 130 may correspond to decoding of the word line associated with the address decoder 116 or the word line driver 108. A toggle event 130 may correspond to an update of one of the global latches 111. A toggle event 130 can include multiplexing of global latches 111. A toggle event 130 can include an update to the output latch 113. A toggle event 130 may include any combination of changes in state respective to the interoperable hardware components 104.

Referring to FIG. 2, a model 200 of the arrangement of interoperable hardware components 104 in accordance with one or more embodiments of the present invention is shown. The model 200 can be defined by any hardware description language 202 (e.g., VHDL, VeriLog). The hardware description language 202 may describe any number of entities defining the interoperable hardware components 104 and the architecture describing the arrangement of interoperable hardware components 104.

Figure 3A:
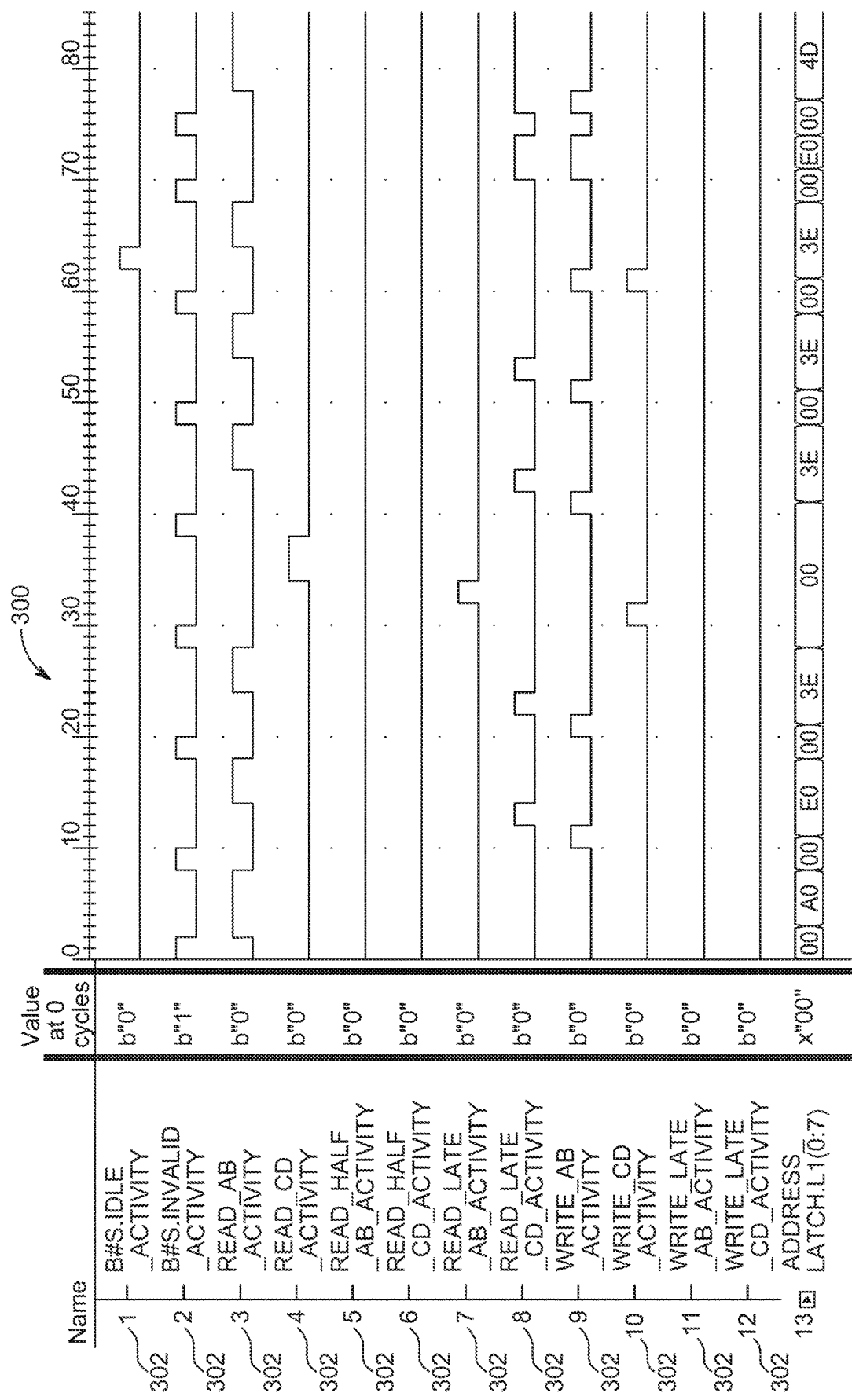
FIG. 3A illustrates activities and events associated with the distinct circuitry in accordance with one or more embodiments of the present invention.
Figure 3B:
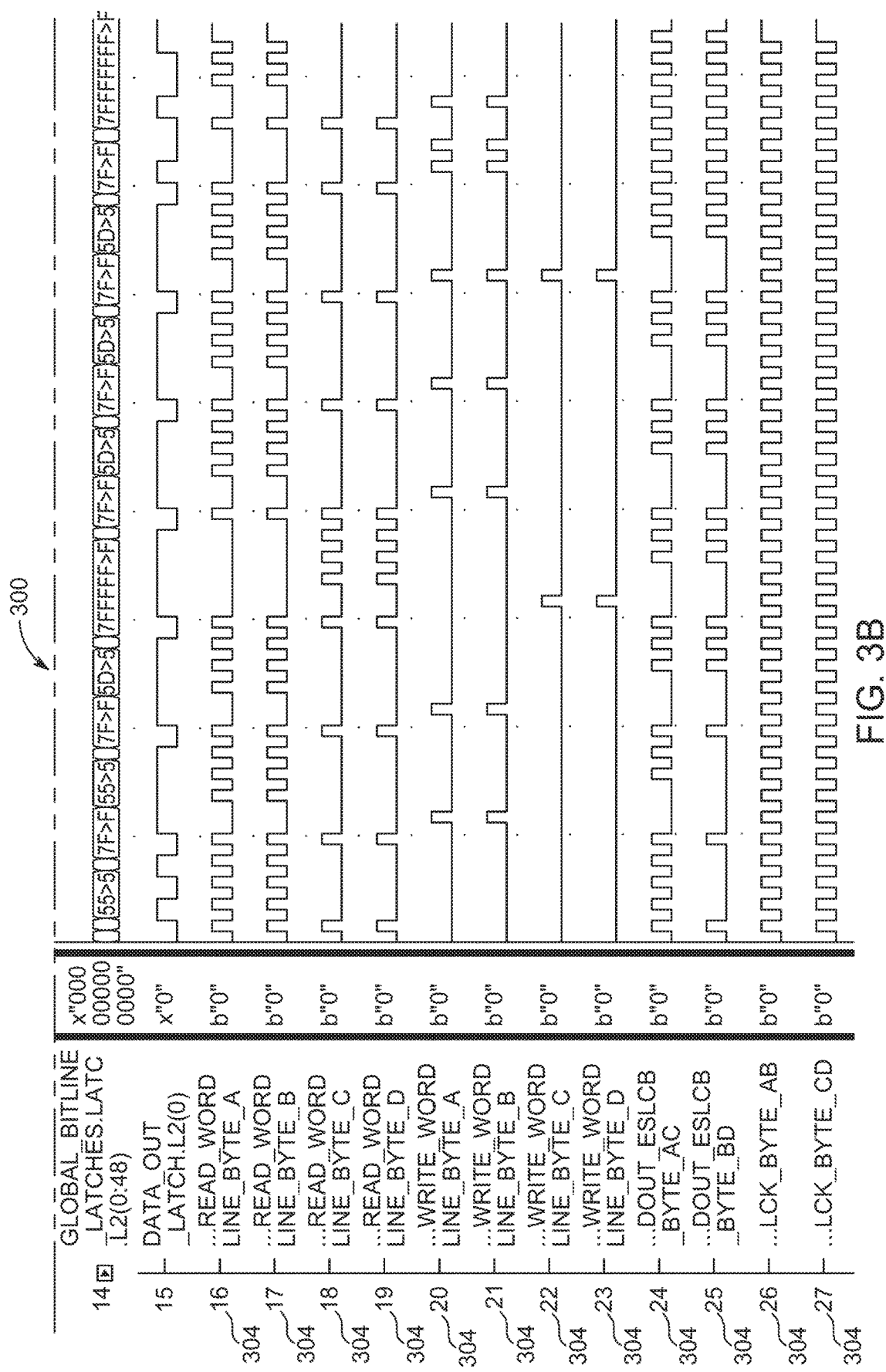
FIG. 3B illustrates activities and events associated with the distinct circuitry in accordance with one or more embodiments of the present invention.

Referring to FIGS. 3A-3B, the model 200 may be emulated on a processing system to produce an emulation graph 300. The emulation graph 300 may include any number of valid activities 302 and combinations 304 of toggle events 130. The emulation graph 300 may be produced using emulation software configured to translate the model 200 into valid activities 302 and combinations 304 of toggle events 130. The valid activities 302 may be defined using functional coverage and assertion instrumentation relative to the input pins 114, 118, 120, 122. Assertion instrumentation may be any instrument to determine functional coverage for design verification. The assertion instrumentation may be defined in a domain specific language (DSL). As an example, Property Specification Language (PSL) may be used to enable verification (e.g., BugSpray). The assertion instrumentation may be further configured to define combinations 304 of the toggle events 130.

The valid activities 302 correspond to valid combinations of logic states based on the input pins 114, 118, 120, 122. The valid activities 302 may be valid combinations of the logic states of the input pins 114, 118, 120, 122. The combinations 304 of toggle events 130 correspond to predetermined power quantities. The predetermined power quantities may be transistor level power (TLP) patterns. The TLP patterns may have predetermined definitions (e.g., read word line development, output latch clock event). A collective of events that provide the evaluation may be defined as a read word line development. As such, the combinations 304 of toggle events 130 that define a toggle event count of aggregated combinations 304 of toggle events 130 is multiplied by the corresponding TLP pattern provides the aggregate toggle power consumption (ATPC), as provided in Equation 1 below.

$$\Sigma \text{Combinations } 304 * TLP \text{ Patterns} = \text{ATPC} \tag{1}$$

The valid activities 302 may be associated with power consumptions that provide an aggregate pin power consumption (APPC). As such, the estimations provided by ATPC and APPC are related to the actual power consumption of the distinct circuitry 100. The ATPC may be closer to the actual power consumption of the distinct circuitry 100 than the APPC, leading to a technical improvement in the design of distinct circuitry. Such an improvement allows distinct circuitry 100 to be designed closer to system and design constraints without unnecessary safety factor. As an example, memory arrays that include numerous memory cells 106 or combinations of memory cells 106 may be designed to draw less power using the APPC method to meet desired safety factors. Such devices designed with APPC include having slower speeds or less capacity with respect to distinct circuitry 100 designed with ATPC.

Figure 4:
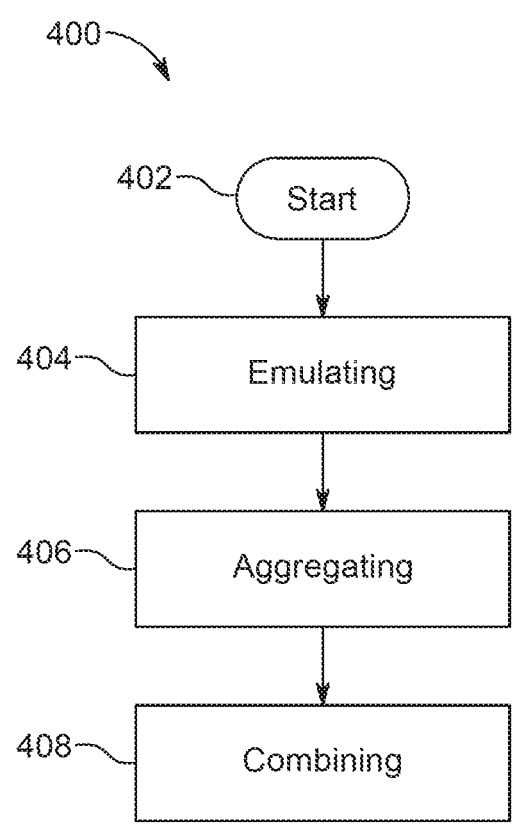
FIG. 4 illustrates a method for error minimization in accordance with one or more embodiments of the present invention.

Referring to FIG. 4, a method 400 is shown. It should be appreciated that the method 400 may be a step-by-step process for carrying out the error minimization between the actual power consumption and the ATPC. It should be appreciated that any of the blocks or steps may be rearranged, omitted, or completed concurrently. The method 400 begins at block 402. In block 404, toggle events 130 defined by a hardware description language 202 are emulated. The hardware description language 202 may define a model 200 that specifies an arrangement of interoperable hardware components 104. The interoperable hardware components 104 are associated with input pins 114, 118, 120, 122 of the distinct circuitry 100. Emulation may be performed by any package or system configured to operate the distinct circuitry 100 or simulations thereof to produce produced power characteristics associated with the distinct circuitry 100.

In block 406, the toggle events 130 are aggregated. Aggregation may be a summation of the toggle events 130. The aggregation may include separation of the toggle events 130 into toggle event categories or combinations thereof for combination with the corresponding predetermined power quantities. As an example, the combinations 304 of the toggle events 130 that correspond to the predetermined power quantities include a word line decode event and updating a global latch 111 that correspond with a TLP pattern defined as a read word line development. The read word line development corresponds with a particular power consumption, such as mW, μW, nW, or pW (e.g., 10 pW). As another example, the combinations 304 of the toggle events 130 may be a global latch multiplex event and updating the output latch 113 that correspond with a TLP pattern defined as an output latch clock event. The output latch clock event corresponds with a particular power consumption, such as mW, μW, nW, or pW (e.g., 15 pW).

In block 408, the toggle events 130 are combined with the predetermined power quantities to define the ATPC. The ATPC is closer to the actual power consumption of the distinct circuitry 100 than an APPC. As an oversimplified example, the distinct circuitry 100 may be installed in an apparatus allotting 50 mW of power consumption. The actual power consumption of the distinct circuitry 100 may be devised to always be less than 45 mW, providing adequate buffer to ensure the 50 mW limit is not exceeded. The ATPC may define the estimated power consumption of the distinct circuitry 100 to be 39 mW, while the APPC may define the estimated power consumption of the distinct circuitry 100 to be 44 mW. The actual power consumption of the distinct circuitry 100 may be 38 mW. As such, the distinct circuitry 100 may be increased in speed, or capacity to decrease the safety band such that the actual power consumption—and the ATPC estimate—is closer to the 45 mW threshold.

Figure 5:
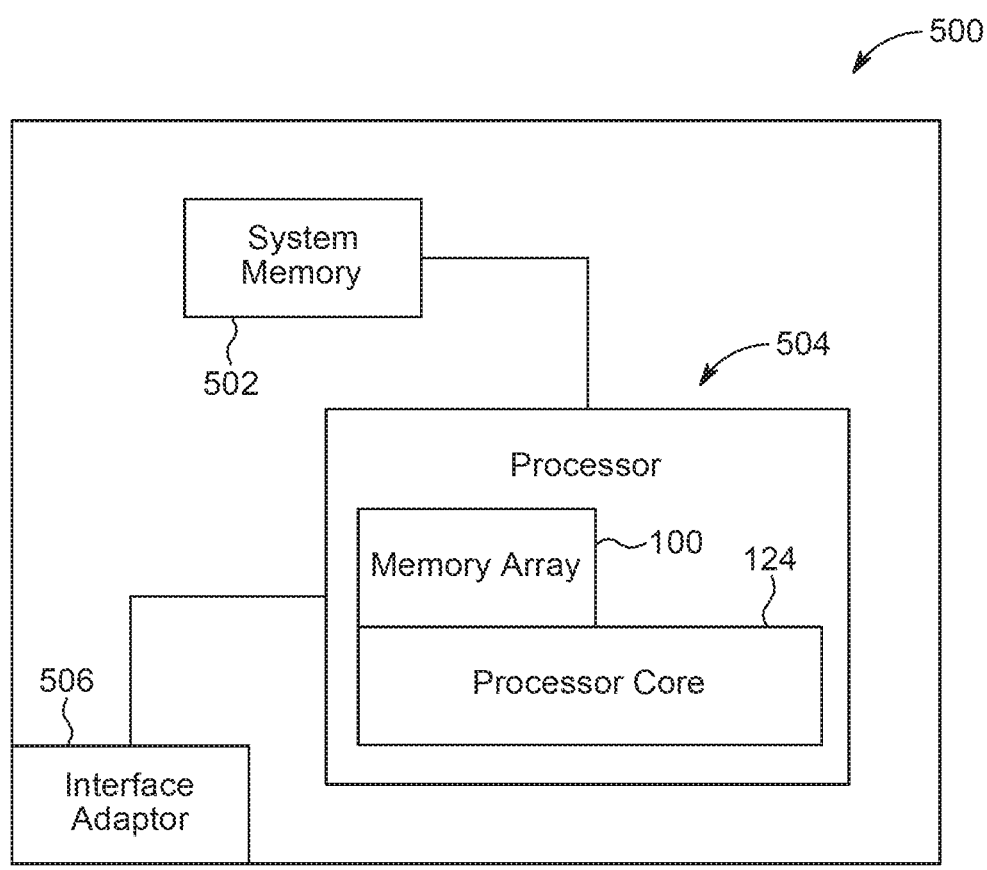
FIG. 5 illustrates a computer system for emulating a model in accordance with one or more embodiments of the present invention.

Turning now to FIG. 5, a computer system 500 is generally shown in accordance with an embodiment. The computer system 500 can be an electronic, computer framework comprising and/or employing any number and combination of computing devices and networks utilizing various communication technologies, as described herein. The computer system 500 can be easily scalable, extensible, and modular, with the ability to change to different services or reconfigure some features independently of others. The computer system 500 may be, for example, a server, desktop computer, laptop computer, tablet computer, or smartphone. In some examples, computer system 500 may be a cloud computing node. Computer system 500 may be described in the general context of computer system executable instructions, such as program modules, being executed by a computer system. Generally, program modules may include routines, programs, objects, components, logic, data structures, and so on that perform particular tasks or implement particular abstract data types. Computer system 500 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, the computer system 500 has one or more processor core(s) 124). The processor core 124, also referred to as processing circuits, are coupled to the memory array 100, the system memory to a system memory 502, or both. The processor core 124 may be part of a larger central processors 504 or processing system. The processing system 504 may be distributed. It should be appreciated that the memory array 100 or teachings related to the memory array 100 may be applied to the system memory 502 and the system memory may similarly include processor cores 124 and other components. A computer program product may be disposed, stored, in any fashion including non-transitorily within the system memory 502 or the memory array 100. The computer program product may be comprised of instructions readable by the processor cores 124 or the central processors 504.

The computer system 500 comprises an interface adaptor 506. The interface adaptor 506 comprises hardware and instructions for communication, control, operation, and display. As an example, the interface adaptor 506 may provide a networked connection to other computer systems. The interface adaptor 506 may provide a display interface connection. The interface adaptor may provide other human-machine interfaces such as a mouse or a keyboard Emulation of the stored instructions or the model 200 may be stored on the system memory 502, the memory array 100, or on any other connected system related to the computer system 500. In one or more embodiments of the present invention, a portion of the system memory 502, the memory array 100, or other memories collectively store an operating system, which may be any appropriate operating system, such as the z/OS or AIX operating system from IBM Corporation, to coordinate the functions of the various components shown in FIGS. 1-5.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Circuitry refers to any combination of logic, wires, fundamental components, transistors, diodes, latches, switches, flip-flops, or other implements, that may be arranged to carry the intended output or disclosed operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The instructions disclosed herein, which may execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array having an optimized power consumption definition, the memory array comprising:
   a substrate; and
   an arrangement of interoperable hardware components disposed on the substrate to form cells and related circuitry having input pins defined according to a model described by a hardware description language operable to emulate toggle events of the interoperable hardware components defined by the model having a toggle event count based on combinations of the toggle events that correspond to predetermined power quantities, the toggle event count defines an aggregate toggle power consumption of the memory array.

2. The memory array of claim 1, wherein the aggregate toggle power consumption is closer to an actual power consumption of the memory array than an aggregate pin power consumption of the memory array.

3. The memory array of claim 2, wherein the aggregate pin power consumption is defined according to valid activities associated with the input pins, and the valid activities describe valid activity combinations of logic states based on the input pins.

4. The memory array of claim 1, wherein the combinations of the toggle events that correspond to the predetermined power quantities comprise at least two toggle events for each of the predetermined power quantities.

5. The memory array of claim 4, wherein the combinations of the toggle events that correspond to the predetermined power quantities comprise a word line decode event and a global latch update that correspond with a TLP pattern defined as a read word line development.

6. The memory array of claim 1, wherein the cells comprise memory cells.

7. The memory array of claim 6, wherein the memory array is a level-one cache associated with a processor core.

8. The memory array of claim 1, wherein the combinations of the toggle events are defined by assertion instrumentation configured to identify valid combinations of the toggle events.

9. A method for minimizing error between an actual power consumption of distinct circuitry and an estimated power consumption, the method comprising:
   emulating toggle events defined by a hardware description language that specifies an arrangement of interoperable hardware components having input pins associated with the distinct circuitry;
   aggregating the toggle events to form a toggle event count according to combinations of the toggle events corresponding to predetermined power quantities; and
   combining the predetermined power quantities according to the combinations of the toggle events to define an aggregate toggle power consumption such that the aggregate toggle power consumption associated with the distinct circuitry is closer to the actual power consumption than an aggregate pin power consumption associated with the distinct circuitry.

10. The method of claim 9, wherein the aggregate pin power consumption is defined according to valid activities associated with the input pins, and the valid activities describe valid activity combinations of logic states based on the input pins.

11. The method of claim 9, wherein the combinations of the toggle events that correspond to the predetermined power quantities comprise at least two toggle events for each of the predetermined power quantities.

12. The method of claim 9, wherein the combinations of the toggle events that correspond to the predetermined power quantities comprise a word line decode event and a global latch update that correspond with a TLP pattern defined as a read word line development.

13. The method of claim 9, wherein the combinations of the toggle events that correspond to the predetermined power quantities comprise a global latch multiplex event and an output latch update that correspond with a TLP pattern defined as an output latch clock event.

14. The method of claim 9, wherein the combinations of the toggle events are defined by assertion instrumentation configured to identify valid combinations of the toggle events.

15. The method of claim 9, wherein the arrangement of interoperable hardware components forms a memory array having individual memory cells, the memory array having the input pins.

16. The method of claim 15, wherein the individual memory cells are disposed on a substrate that includes a processor core, and the memory array is a level-one cache associated with the processor core.

17. A computer program product for optimizing a power consumption definition of a memory array having an actual power consumption, the computer program product comprising:
    a non-transitory digital storage device; and
    stored instructions stored on the digital storage device operable upon execution by a processor to aggregate emulated toggle events defined by a hardware description language in a model that specifies the memory array having an arrangement of interoperable hardware components and defines input pins, the emulated toggle events form a toggle event count according to a plurality of combinations of the toggle events corresponding to predetermined power quantities to define an aggregate toggle power consumption such that the aggregate toggle power consumption associated with distinct circuitry is closer to the actual power consumption than an aggregate pin power consumption based on the input pins associated with the memory array.

18. The computer program product of claim 17, wherein the aggregate pin power consumption is defined according to valid activities associated with the input pins, and the valid activities describe valid activity combinations of logic states based on the input pins.

19. The computer program product of claim 17, wherein the combinations of the toggle events that correspond to the predetermined power quantities comprise at least two toggle events for each of the predetermined power quantities.

* * * * *